(12) United States Patent
Sato

(10) Patent No.: US 11,217,469 B2
(45) Date of Patent: Jan. 4, 2022

(54) SUBSTRATE TRANSFER APPARATUS

(71) Applicant: TOKYO ELECTRON LIMITED, Tokyo (JP)

(72) Inventor: Taiki Sato, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/874,015

(22) Filed: May 14, 2020

(65) Prior Publication Data

US 2020/0365438 A1     Nov. 19, 2020

(30) Foreign Application Priority Data

May 17, 2019 (JP) .............................. JP2019-093427

(51) Int. Cl.
| | |
|---|---|
| *H01L 21/67* | (2006.01) |
| *H01L 21/677* | (2006.01) |
| *B65G 47/90* | (2006.01) |
| *H01L 21/687* | (2006.01) |

(52) U.S. Cl.
CPC ........ *H01L 21/67742* (2013.01); *B65G 47/90* (2013.01); *H01L 21/68707* (2013.01)

(58) Field of Classification Search
None
See application file for complete search history.

(56) References Cited

U.S. PATENT DOCUMENTS

| | | | |
|---|---|---|---|
| 5,522,937 A  * | 6/1996 | Chew .................... | C23C 16/458 118/728 |
| 6,861,614 B1 * | 3/2005 | Tanabe ................... | B23K 26/04 219/121.66 |
| 2018/0082879 A1 * | 3/2018 | Jung ................. | H01L 21/67259 |

FOREIGN PATENT DOCUMENTS

JP         2013-77667 A      4/2013

* cited by examiner

*Primary Examiner* — Ronald P Jarrett
(74) *Attorney, Agent, or Firm* — Fenwick & West LLP

(57) ABSTRACT

A vacuum transfer apparatus includes a vacuum chamber, a transfer robot, and a bellows. The vacuum chamber has a through-hole communicating with an outside. The transfer robot includes an arm unit disposed in the vacuum chamber to support a substrate, a support unit configured to support the arm unit while passing through the through-hole with a gap between the support unit and the through-hole, and a base unit disposed at the outside of the vacuum chamber to support the support unit. The bellows surrounds a periphery of the support unit and is sealed and attached to the arm unit and an inner wall of the vacuum chamber around the through-hole.

8 Claims, 4 Drawing Sheets

SUBSTRATE TRANSFER APPARATUS

CROSS-REFERENCE TO RELATED APPLICATIONS

This application claims priority to Japanese Patent Application No. 2019-093427, filed on May 17, 2019, the entire contents of which are incorporated herein by reference.

TECHNICAL FIELD

The present disclosure relates to a substrate transfer apparatus.

BACKGROUND

Japanese Patent Application Publication No. 2013-77667 discloses a vacuum transfer apparatus in which a transfer robot is attached to a part of a wall of a vacuum chamber through an O-ring.

The present disclosure provides a technique for suppressing a transfer error of a transfer robot even when a vacuum chamber is deformed.

SUMMARY

In accordance with an aspect of the present disclosure, there is provided a vacuum transfer apparatus including: a vacuum chamber having a through-hole communicating with an outside; a transfer robot including an arm unit disposed in the vacuum chamber to support a substrate, a support unit configured to support the arm unit while passing through the through-hole with a gap between the support unit and the through-hole, and a base unit disposed at the outside of the vacuum chamber to support the support unit; and a bellows that surrounds a periphery of the support unit and is sealed and attached to the arm unit and an inner wall of the vacuum chamber around the through-hole.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, a vacuum transfer apparatus according to an embodiment will be described in detail with reference to the accompanying drawings. Further, the vacuum transfer apparatus of the present disclosure is not limited by the following embodiment.

When an internal pressure of the vacuum chamber is changed from an atmospheric pressure state to a vacuum state, the vacuum chamber is deformed by an atmospheric pressure. The vacuum chamber is also deformed by a temperature change. Therefore, even when a transfer robot is attached to a sidewall of the vacuum chamber through an O-ring as disclosed in Japanese Patent Application Publication No. 2013-77667, stress caused by the deformation of the vacuum chamber is transmitted to the transfer robot through the O-ring. Thus, a position and an incline of the transfer robot are changed. When the position and the incline of the transfer robot are changed, a transfer position of a substrate is changed even if the same operation is performed, which results in a transfer error. Accordingly, it is desired to suppress the transfer error of the transfer robot even when the vacuum chamber is deformed.

(Configuration of the Vacuum Transfer Apparatus)

Figure 1:
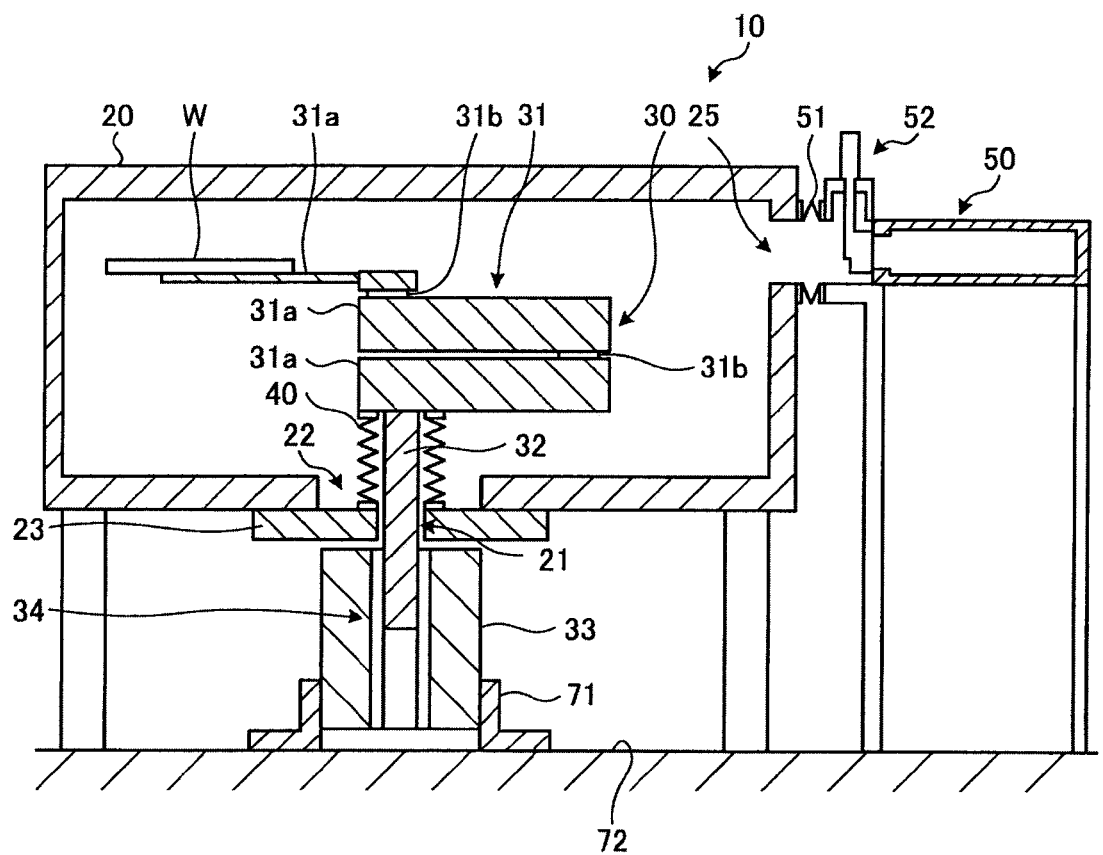
FIG. 1 shows an example of a schematic configuration of a vacuum transfer apparatus according to an embodiment.
Figure 1:
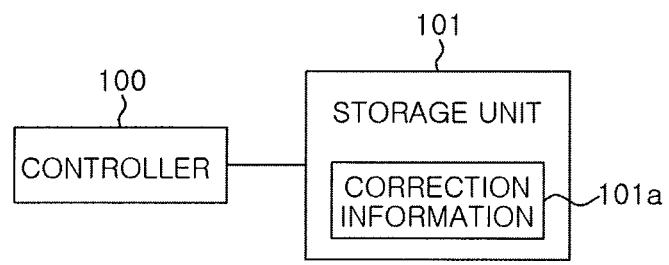

An example of the vacuum transfer apparatus according to an embodiment will be described. FIG. 1 shows an example of a schematic configuration of a vacuum transfer apparatus 10 according to the embodiment. The vacuum transfer apparatus 10 according to the embodiment transfers a substrate in a depressurized state. Hereinafter, a case where a semiconductor wafer (hereinafter, referred to as "wafer") is used as an example of the substrate will be described as an example.

The vacuum transfer apparatus 10 includes a vacuum chamber 20. The vacuum chamber 20 has a flat box shape and a pressure therein can be decreased to a predetermined vacuum level by a vacuum pump (not shown). A through-hole 21 communicating with the outside is formed on the vacuum chamber 20. For example, an opening 22 is formed on a part of a wall forming a housing for the vacuum chamber 20. In the present embodiment, the opening 22 is formed on a part of a wall forming a bottom surface of the vacuum chamber 20. In the vacuum chamber 20, the opening 22 is sealed from the outside by a flat plate-shaped flange 23. The flange 23 forms a part of a wall of a lower part of the vacuum chamber 20. A through-hole 21 is formed in the flange 23.

The vacuum transfer apparatus 10 includes a transfer robot 30. The transfer robot 30 is attached to the vacuum chamber 20. The transfer robot 30 has an arm unit 31, a support unit 32, and a base unit 33.

The arm unit 31 is disposed in the vacuum chamber 20. The arm unit 31 is configured as a multi-joint arm in which a plurality of arms 31a is connected by joints 31b. In the arm unit 31 of the present embodiment, three arms 31a are connected by the joints 31b. The joints 31b cause the arms 31a to rotate in a horizontal direction. The arm unit 31 can be extended and contracted in the horizontal direction by rotating the arms 31a through the joints 31b and transfers the wafer W held by the leading arm 31a.

The arm unit 31 is supported by the support unit 32. The support unit 32 is formed in a columnar shape to penetrate through the through-hole 21. A predetermined gap is formed between the support unit 32 and a peripheral surface of the through-hole 21. The arm unit 31 is supported by an upper end of the support unit 32. A lower part of the support unit 32 is supported by the base unit 33.

The base unit 33 is disposed outside of the vacuum chamber 20. The base unit 33 is fixed to a floor 72 by a bracket 71. The base unit 33 is provided with a lifting mechanism 34 for raising and lowering the support unit 32. The transfer robot 30 can raise and lower the arm unit 31 by raising and lowering the support unit 32 using the lifting mechanism 34 of the base unit 33.

A bellows 40 is disposed to surround a periphery of the support unit 32. The bellows 40 has a lower end attached to an inner wall of the vacuum chamber 20 around the through-hole 21 and an upper end attached to the arm unit 31. A gap between the lower end of the bellows 40 and the inner wall of the vacuum chamber 20 and a gap between the upper end of the bellows 40 and the arm unit 31 are respectively sealed by sealing members (not shown). In the vacuum transfer apparatus 10, the through-hole 21 is sealed by the bellows 40 and the arm unit 31 to prevent air from flowing into the vacuum chamber 20 through the through-hole 21.

The vacuum chamber 20 includes a transfer port 25 for transferring the wafer W. The transfer port 25 is connected to a processing chamber 50 through a bellows 51. The processing chamber 50 includes a gate valve 52. A gap between the bellows 51 and an outer wall of the vacuum chamber 20 and a gap between the bellows 51 and the gate valve 52 are respectively sealed by sealing members (not shown). The inner space of the processing chamber 50 can be depressurized to a predetermined vacuum level by a vacuum pump (not shown) and substrate processing is performed in the depressurized state. The substrate processing includes, e.g., film formation, etching, or the like. The substrate processing may be a processing that uses the plasma or a processing that does not use the plasma.

The transfer robot 30 extends and contracts the arm unit 31 to transfer the wafer W from the transfer port 25 to the processing chamber 50 through the bellows 51. For example, in the case of performing the substrate processing on the wafer W, the transfer robot 30 extends and contracts the arm unit 31 to transfer the wafer W from the transfer port 25 to the processing chamber 50 through the bellows 51. Then, in the processing chamber 50, the gate valve 52 is closed and the substrate processing is performed on the wafer W.

The vacuum transfer apparatus 10 includes a controller 100 and a storage unit 101. Each of the controller 100 and the storage unit 101 is, e.g., a computer.

The storage unit 101 is configured to store various programs such as a control program for controlling the vacuum transfer apparatus 10. The storage unit 101 is further configured to store various data such as processing conditions used in the program. For example, the storage unit 101 stores correction information 101a. The various programs and various data may be stored in a computer-readable storage medium (e.g., a hard disk, an optical disk such as a DVD or the like, a flexible disk, a semiconductor memory, or the like). Further, various programs and various data may be stored in another apparatus, and read out and used online through, e.g., a dedicated line.

The controller 100 reads out the various programs such as the control program stored in the storage unit 101 and the like to control the operation of the vacuum transfer apparatus 10. For example, the controller 100 controls the operation of the arm unit 31. Further, the controller 100 controls the lifting mechanism 34 based on the correction information 101a stored in the storage unit 101.

Next, a process of installing the vacuum transfer apparatus 10 of the present embodiment will be described.

Figure 2:
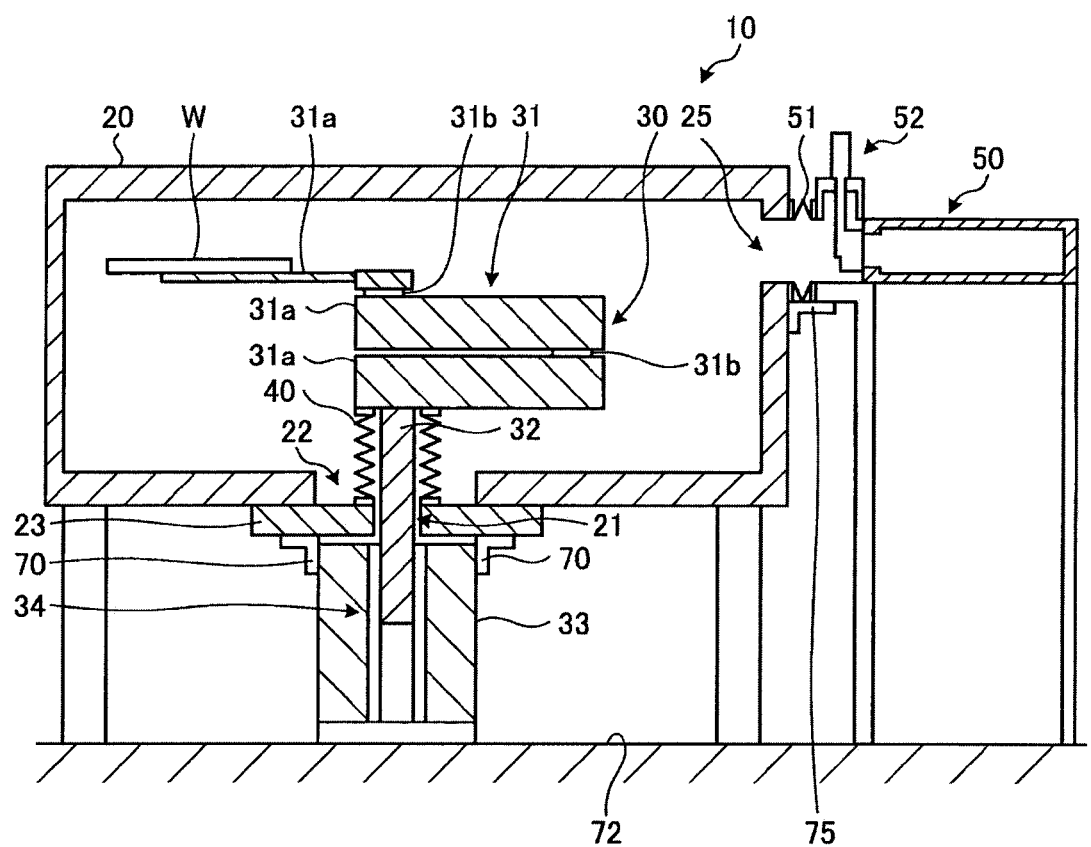
FIGS. 2 and 3 show an example of a process of installing the vacuum transfer apparatus according to the embodiment.
Figure 3:
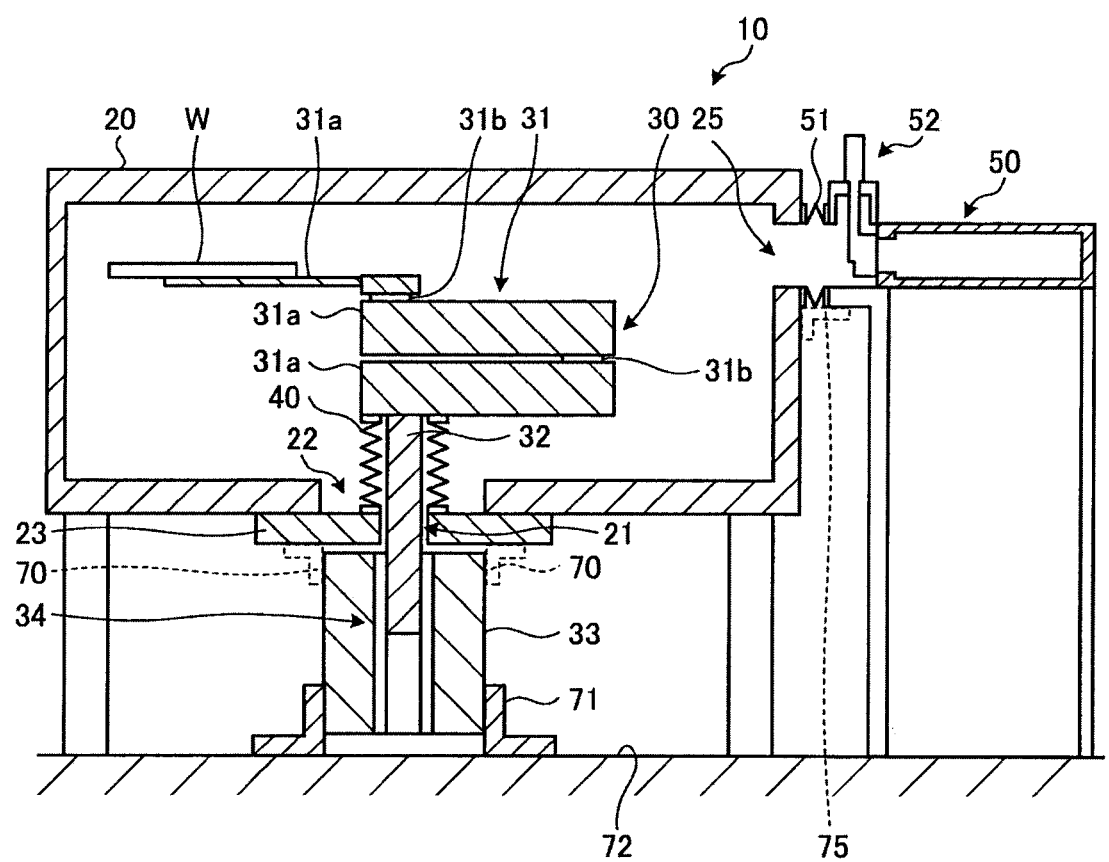

FIGS. 2 and 3 show an example of a process of installing the vacuum transfer apparatus 10 of the present embodiment. As shown in FIG. 2, the base unit 33 of the transfer robot 30 is fixed to the flange 23 by a bracket 70. The opening 22 of the vacuum chamber 20 has a size that allows the contracted arm unit 31 to pass therethrough. In the vacuum transfer apparatus 10, the transfer robot 30 is fixed to the vacuum chamber 20 by sealing the opening 22 with the flange 23 from the outside of the vacuum chamber 20 in a state where the arm unit 31 is passed through the opening 22. Since the base unit 33 is fixed to the vacuum chamber 20 by the bracket 70, the transfer robot 30 is moved together with the vacuum chamber 20 at the time of installing the vacuum transfer apparatus 10. Therefore, when the vacuum transfer apparatus 10 is installed, the transfer robot 30 can be arranged while maintaining the positional relationship between the transfer robot 30 and the vacuum chamber 20. In other words, when the vacuum transfer apparatus 10 is installed, the transfer robot 30 can be positioned at a specific initial position relative to the vacuum chamber 20. Further, since the base unit 33 is fixed to the vacuum chamber 20 by the bracket 70, even if the vacuum chamber 20 and the transfer robot 30 are moved, it is possible to prevent the bellows 40 from being damaged by an excessive load.

After the vacuum chamber 20 and the transfer robot 30 are moved and positionally aligned, the base unit 33 is fixed to the floor 72 by the bracket 71 as shown in FIG. 3. Accordingly, the arrangement position of the transport robot 30 is fixed. After the base unit 33 is fixed to the floor 72 by the bracket 71, the bracket 70 is removed. By removing the bracket 70, the transfer robot 30 is in a state where the base unit 33 is separated from the vacuum chamber 20. Further, since the gap is present between the support unit 32 and the through-hole 21, the support unit 32 is separated from the vacuum chamber 20. Further, a portion where the base unit 33 is fixed to the floor 72 may be marked on the floor 72. For example, in the case of replacing the transfer robot 30, the base unit 33 is fixed to the floor 72 at the marked position on the floor 72, so that the transfer robot 30 can be installed at the same position as that before the replacement.

When the processing chamber 50 is connected to the vacuum transfer apparatus 10, the vacuum chamber 20 and the processing chamber 50 are positionally aligned while being connected by a bracket 75 as shown in FIG. 2. After the position-alignment, the bracket 75 is removed as shown in FIG. 3. By removing the bracket 75, the vacuum chamber 20 and the processing chamber 50 are now connected by the bellows 51. Accordingly, it is possible to suppress the stress caused by the deformation of the vacuum chamber 20 from being transmitted to the processing chamber 50.

In the vacuum transfer apparatus 10, when the internal pressure of the vacuum chamber 20 is changed from an atmospheric pressure state to a vacuum state, the vacuum chamber 20 is deformed by the atmospheric pressure. Further, the temperature of the vacuum chamber 20 is changed by heat transferred from the substrate processing performed in the processing chamber 50, and the vacuum chamber 20 is deformed by the temperature change.

In the vacuum transfer apparatus 10, when the vacuum chamber 20 is deformed, the stress caused by the deformation of the vacuum chamber 20 is transmitted to the transfer robot 30, which may result in the changes in the position and the incline of the transfer robot 30. When the position and the incline of the transfer robot 30 are changed, the transfer position of the wafer W is changed even if the transfer robot 30 performs the same operation. Accordingly, a transfer error of the transfer robot 30 occurs.

The number of the processing chambers 50 to be connected to the vacuum transfer apparatus 10 tends to increase and the size of the vacuum transfer apparatus 10 tends to increase. In the vacuum transfer apparatus 10, the increase in the size of the vacuum chamber 20 and the transfer robot 30 is necessary to transfer the wafer W in a vacuum state in a wider range.

However, in the vacuum transfer apparatus 10, the increased size of the vacuum chamber 20 leads to an increase in the amount of deformation of the vacuum chamber 20 after evacuation, and the transfer error of the transfer robot 30 increases due to the deformation of the vacuum chamber 20.

In this connection, the reduction in the amount of deformation of the vacuum chamber 20 by increasing a thickness of the wall of the vacuum chamber 20 is considered. Further, the increase of a clearance between a transfer area of the transfer robot 30 and the inner wall of the vacuum chamber 20 is considered to prevent the arm unit 31 from colliding with the vacuum chamber 20 even if the transfer error increases. In addition, in order to deal with the lowering of the tip end position of the extended arm unit 31 due to the deformation of the vacuum chamber 20, the increase of the height of the vacuum chamber 20 to increase the vertical movement range of the transfer robot 30 is considered.

However, in the above-described cases, the vacuum transfer apparatus 10 has the problem in that the size of the vacuum chamber 20 is increased, thereby increasing the cost.

Therefore, in the vacuum transfer apparatus 10 of the present embodiment, the support unit 32 for supporting the arm unit 31 of the transfer robot 30 passes through the through-hole 21 with a gap between the support unit 32 and the through-hole 21. Accordingly, the stress caused by the deformation of the vacuum chamber 20 is not transmitted to the support unit 32, so that the position and the incline of the transfer robot 30 are not changed. The gap between the through-hole 21 and the support unit 32 is preferred to be greater than or equal to the amount of deformation of the vacuum chamber 20. For example, the gap may be about several centimeters. As a result, the vacuum transfer apparatus 10 of the present embodiment can suppress the transfer error of the transfer robot 30 even when the vacuum chamber 20 is deformed.

Further, in the vacuum transfer apparatus 10 of the present embodiment, the bellows 40 is disposed to surround the periphery of the support unit 32. The bellows 40 is sealed and attached to the arm unit 31 and the inner wall of the vacuum chamber 20 around the through-hole 21. Therefore, the inside of the vacuum chamber 20 is blocked from the atmosphere and, thus, can be depressurized and maintained in a vacuum state. Further, since the bellows 40 is easily deformed, even if a portion of the vacuum chamber 20 to which one end of the bellows 40 is attached is deformed, the stress applied to a portion of the transfer robot 30 to which the other end of the bellows 40 is attached and the stress applied to the sealing portions at both ends of the bellows 40 are suppressed to be negligible. Accordingly, the vacuum transfer apparatus 10 of the present embodiment can maintain the vacuum state while suppressing the influence of the deformation of the vacuum chamber 20 on the transfer robot 30. On the other hand, when the transfer robot is attached to a part of a wall of the vacuum chamber through an O-ring as disclosed in Japanese Patent Application Publication No. 2013-77667, there is a trade-off relationship between a sealing performance and stress suppression due to a mechanism that absorbs the deformation of the vacuum chamber caused by the deformation of the O-ring.

Further, in the vacuum transfer apparatus 10 of the present embodiment, the base unit 33 is provided with the lifting mechanism 34 for vertically moving the support unit 32. If the lifting mechanism 34 is disposed on a vacuum side, e.g., inside the vacuum chamber 20 or the like, the lifting mechanism 34 may cause the generation of particles. In the vacuum transfer apparatus 10 of the present embodiment, the lifting mechanism 34 is disposed in the base unit 33 on an atmospheric pressure side, so that it becomes possible to suppress the particles caused by the lifting mechanism 34 from being generated in the vacuum chamber 20 even when the support unit 32 is vertically moved by the lifting mechanism 34.

Further, the tip end of the arm unit 31 of the transfer robot 30 is lowered due to the influence of gravity. The amount of lowering of the tip end of the arm unit 31 is increased as the arm unit 31 is extended.

Figure 4:
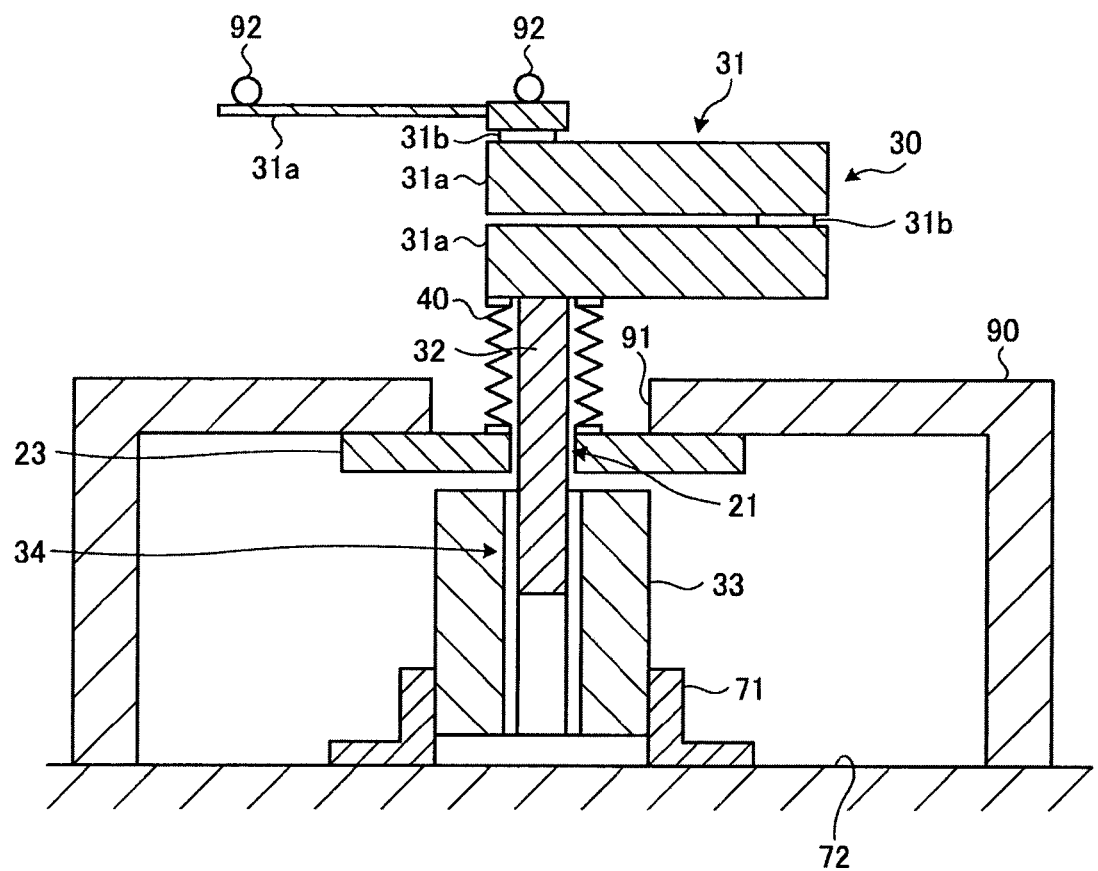
FIG. 4 shows an example of a measurement of the amount of lowering of a tip end of an arm unit according to the embodiment.

Therefore, in the vacuum transfer apparatus 10 of the present embodiment, correction information 101a for correcting the lowering of the tip end of the arm unit 31 is stored in the storage unit 101. The correction information 101a is generated by extending and contracting the arm unit 31 of the transfer robot 30 under an atmospheric pressure state and measuring the position of the tip end of the arm unit 31. FIG. 4 shows an example of the measurement of the lowering amount of the tip end of the arm unit 31 according to the embodiment. The transfer robot 30 is in the atmospheric pressure state without being attached to the vacuum chamber 20. For example, the transfer robot 30 is attached to a frame 90 that imitates the configuration of the lower part of the vacuum chamber 20 of the vacuum transfer apparatus 10. The frame 90 is in the atmospheric pressure state. An opening 91 similar to the opening 22 is formed in the frame 90.

A marker 92 for position measurement is attached to multiple positions including the tip end of the arm unit 31 of the transfer robot 30. The vertical positions of the markers 92 of the arm unit 31 are measured while extending and contracting the arm unit 31 of the transfer robot 30, and the amount of lowering of the tip end of the arm unit 31 with respect to the amount of extension/contraction of the arm unit 31 is obtained. Then, the correction information 101a on the correction amount of the position of the tip end of the arm unit 31 with respect to the amount of extension/contraction of the arm unit 31 is generated from the amount of lowering of the tip end of the arm unit 31 with respect to the amount of extension/contraction of the arm unit 31. For example, the amount of lowering of the tip end of the arm unit 31 is stored as the correction amount in the correction information 101a.

Meanwhile, when the arm unit 31 of the transfer robot 30 is extended, the horizontal position of the tip end of the arm unit 31 is also changed as the tip end of the arm unit 31 is lowered. However, the change in the position of the tip end of the arm unit 31 due to the influence of gravity is greater in the vertical direction than in the horizontal direction. Therefore, in the present embodiment, the case of correcting the change in the vertical position is described. However, the present disclosure is not limited thereto and the change in the horizontal position may also be corrected. For example, the amount of lowering of the tip end of the arm unit 31 together with the amount of change in the horizontal direction may be stored as the correction amount in the correction information 101a. Then, the position of the arm unit 31 in the horizontal direction may be corrected based on the stored amount of change in the horizontal direction. Further, the lifting amount of the arm unit 31 required to correct the lowering of the tip end of the arm unit 31 may be stored as the correction amount in the correction information 101a. Alternatively, the amount of lowering of the tip end of the arm unit 31 with respect to the amount of extension/contraction of the arm unit 31 may be measured in a state where the inside of the vacuum chamber 20 is set to the atmospheric pressure state after the transfer robot 30 is attached to the vacuum transfer apparatus 10 as shown in FIG. 1.

As described above, even when the transfer robot 30 is attached to the vacuum chamber 20, the transfer robot 30 is not affected by the deformation of the vacuum chamber 20. However, the tip end of the arm unit 31 of the transfer robot 30 is lowered due to the influence of gravity even in the vacuum chamber 20 in a vacuum state as well as that in an atmospheric pressure state. Therefore, in the vacuum transfer apparatus 10 of the present embodiment, the correction information 101a generated by measuring the lowering of the tip end of the arm unit 31 under the atmospheric pressure state can be used to correct the lowering of the tip end of the arm unit 31 in the vacuum chamber 20 maintained in the vacuum state.

In the case of operating the arm unit 31, the controller 100 obtains the correction amount of the tip end of the arm unit 31 corresponding to the amount of extension/contraction of the arm unit 31 from the correction information 101a stored in the storage unit 101. Then, the controller 100 controls the lifting mechanism 34 to vertically move the arm unit 31 by the obtained correction amount. Therefore, the vacuum transfer apparatus 10 can correct the lowering of the tip end of the arm unit 31 due to the influence of gravity, which makes it possible to accurately control the arm unit 31 to a target position and to accurately transfer the substrate to a transfer position. Accordingly, the vacuum transfer apparatus 10 can reduce a clearance for the transfer position of the substrate, so that it is possible to suppress the increase in the size of the vacuum chamber 20 and the increase in cost.

As described above, the vacuum transfer apparatus 10 of the present embodiment includes the vacuum chamber 20, the transfer robot 30, and the bellows 40. The vacuum chamber 20 has the through-hole 21 communicating with the outside. The transfer robot 30 includes the arm unit 31 disposed in the vacuum chamber 20 to support the wafer W, the support unit 32 for supporting the arm unit 31 while passing through the through-hole 21 with a gap between the support unit 32 and the through-hole 21, and the base unit 33 disposed at the outside of the vacuum chamber 20 to support the support unit 32. The bellows 40 surrounds the periphery of the support unit 32 and is sealed and attached to the arm unit 31 and the inner wall of the vacuum chamber 20 around the through-hole 21. Therefore, it becomes possible for the vacuum transfer apparatus 10 to suppress a transfer error of the transfer robot 30 even when the vacuum chamber 20 is deformed.

Further, the arm unit 31 may extend and contract in the horizontal direction. The base unit 33 includes the lifting mechanism 34 for vertically moving the support unit 32. The vacuum transfer apparatus 10 may further include the storage unit 101 and the controller 100. The storage unit 101 stores the correction information 101a on the position of the tip end of the arm unit 31 with respect to the amount of extension/contraction of the arm unit 31 measured by extending and contracting the arm unit 31 under the atmospheric pressure state. The controller 100 controls the lifting mechanism 34 based on the correction information 101a. Accordingly, it becomes possible for the vacuum transfer apparatus 10 to accurately control the arm unit 31 to the target position.

Further, the vacuum chamber 20 has the opening 22 formed on a part of the wall of the vacuum chamber 20 to communicate with the outside. The opening 22 is sealed by the flange 23 having the through-hole 21. Thus, in the vacuum transfer apparatus 10, the transfer robot 30 can be attached to the vacuum chamber 20 in such a manner that the arm unit 31 enters into the vacuum chamber 20 through the opening 22.

In the vacuum transfer apparatus 10, the flange 23, by which the transfer robot 30 is fixed through a first fixing member (bracket 70), is attached to the vacuum chamber 20 to seal the opening 22. Further, in the vacuum transfer apparatus 10, after the transfer robot 30 is fixed to the floor by a second fixing member (bracket 71), the first fixing member is removed. Accordingly, the bellows 40 is prevented from being damaged when the vacuum transfer apparatus 10 is installed.

Further, the vacuum chamber 20 is connected to the processing chamber 50 through the bellows 51, the processing chamber 50 being configured to perform substrate processing on the wafer W. Therefore, it becomes possible for the vacuum transfer apparatus 10 to suppress the stress caused by the deformation of the vacuum chamber 20 from being transmitted to the processing chamber 50.

The presently disclosed embodiments are considered in all respects to be illustrative and are not restrictive. The above-described embodiments can be embodied in various forms. Further, the above-described embodiments may be omitted, replaced, or changed in various forms without departing from the scope of the appended claims and the gist thereof.

For example, in the above-described embodiments, the case where the substrate is the wafer W has been described as an example. However, the substrate is not limited thereto and may be other substrates such as a glass substrate and the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A vacuum transfer apparatus comprising:
a vacuum chamber having a through-hole communicating with an outside;
a transfer robot including an arm unit disposed in the vacuum chamber to support a substrate, a support unit formed in a columnar shape and configured to support the arm unit while passing through the through-hole with a gap between the support unit and the through-hole, and a base unit disposed at the outside of the vacuum chamber to support the support unit; and
a bellows that surrounds a periphery of the support unit and is sealed and attached to the arm unit and an inner wall of the vacuum chamber around the through-hole,
wherein the vacuum chamber has an opening formed on a part of a wall of the vacuum chamber to communicate with the outside and is sealed from the outside by a flange having the through-hole, and
wherein the bellows is sealed and attached to the arm unit and an inner wall of the flange around the through-hole.

2. The vacuum transfer apparatus of claim 1, wherein the arm unit is extensible and contractible in a horizontal direction,
the vacuum transfer apparatus further comprising:
a storage unit configured to store correction information on a position of a tip end of the arm unit with respect to an amount of extension/contraction of the arm unit measured by extending and contracting the arm unit under an atmospheric pressure state; and
a controller configured to control a vertical movement of the arm unit based on the correction information.

3. The vacuum transfer apparatus of claim 2, wherein the vacuum chamber is connected to a processing chamber through an additional bellows, the processing chamber being configured to perform substrate processing on the substrate.

4. The vacuum transfer apparatus of claim 1, wherein the vacuum chamber is connected to a processing chamber through an additional bellows, the processing chamber being configured to perform substrate processing on the substrate.

5. A vacuum transfer apparatus comprising:
a vacuum chamber having a through-hole communicating with an outside;
a transfer robot including an arm unit disposed in the vacuum chamber to support a substrate, a support unit formed in a columnar shape and configured to support the arm unit while passing through the through-hole with a gap between the support unit and the through-hole, and a base unit disposed at the outside of the vacuum chamber to support the support unit; and
a bellows that surrounds a periphery of the support unit and is sealed and attached to the arm unit and an inner wall of the vacuum chamber around the through-hole,
wherein the vacuum chamber has an opening formed on a part of a wall of the vacuum chamber to communicate with the outside and is sealed by a flange having the through-hole,
wherein the flange, by which the transfer robot is fixed through a first bracket, is attached to the vacuum chamber to seal the opening, and the first bracket is removed after the transfer robot is fixed to a floor by a second bracket.

6. The vacuum transfer apparatus of claim 5, wherein the vacuum chamber is connected to a processing chamber through an additional bellows, the processing chamber being configured to perform substrate processing on the substrate.

7. A vacuum transfer apparatus comprising:
a vacuum chamber having a through-hole communicating with an outside;
a transfer robot including an arm unit disposed in the vacuum chamber to support a substrate, a support unit formed in a columnar shape and configured to support the arm unit while passing through the through-hole with a gap between the support unit and the through-hole, and a base unit disposed at the outside of the vacuum chamber to support the support unit; and
a bellows that surrounds a periphery of the support unit and is sealed and attached to the arm unit and an inner wall of the vacuum chamber around the through-hole,
wherein the arm unit is extensible and contractible in a horizontal direction,
the vacuum transfer apparatus further comprising:
a storage unit configured to store correction information on a position of a tip end of the arm unit with respect to an amount of extension/contraction of the arm unit measured by extending and contracting the arm unit under an atmospheric pressure state; and
a controller configured to control a vertical movement of the arm unit based on the correction information,
wherein the vacuum chamber has an opening formed on a part of a wall of the vacuum chamber to communicate with the outside and is sealed by a flange having the through-hole,
wherein the flange, by which the transfer robot is fixed through a first bracket, is attached to the vacuum chamber to seal the opening, and the first bracket is removed after the transfer robot is fixed to a floor by a second bracket.

8. The vacuum transfer apparatus of claim 7, wherein the vacuum chamber is connected to a processing chamber through an additional bellows, the processing chamber being configured to perform substrate processing on the substrate.

* * * * *